US010211844B1

(12) United States Patent
Molev-Shteiman et al.

(10) Patent No.: US 10,211,844 B1
(45) Date of Patent: Feb. 19, 2019

(54) MINIMUM SEARCH LENGTH ANALOG TO DIGITAL CONVERTER

(71) Applicant: Futurewei Technologies, Inc., Plano, TX (US)

(72) Inventors: Arkady Molev-Shteiman, Basking Ridge, NJ (US); Xiao-Feng Qi, Westfield, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/879,174

(22) Filed: Jan. 24, 2018

(51) Int. Cl.
*H03M 1/38* (2006.01)
*H03M 1/00* (2006.01)

(52) U.S. Cl.
CPC .............. *H03M 1/002* (2013.01); *H03M 1/38* (2013.01)

(58) Field of Classification Search
CPC .................................. H03M 1/002; H03M 1/38
USPC ................................................. 341/161, 155
See application file for complete search history.

(56) References Cited

U.S. PATENT DOCUMENTS

| 9,417,339 | B2* | 8/2016 | Spahn | G01T 1/247 |
| 9,871,529 | B1* | 1/2018 | Chong | H03M 1/38 |
| 9,906,232 | B1* | 2/2018 | Cho | H03M 1/002 |
| 9,929,740 | B2* | 3/2018 | Tang | H03M 1/466 |

OTHER PUBLICATIONS

Parthasarathy, Ananthanarayanan, Design and Analysis of Search Algorithms for Lower Power Consumption and Faster Convergence of DAC Input of SAR-ADC in 65nm CMOS, IEEE, 2015, 6 Pages.

* cited by examiner

*Primary Examiner* — Brian Young
(74) *Attorney, Agent, or Firm* — Vierra Magen Marcus LLP

(57) ABSTRACT

The disclosure relates converting an analog input signal to a digital output signal in a number of successive approximation cycles. A sampled analog input signal is received, and a decision node is loaded from a decision tree stored in memory, where each decision node in the decision tree stores an optimal threshold value and an address to one or more next decision nodes. The optimal threshold value, a first output flag and a second output flag associated with a currently loaded decision node is read from the decision tree in the memory, and the sampled first analog input signal is compared with the optimal threshold value and, based on a result of the comparison, a next decision node is loaded from the decision tree stored in memory according to the address associated with the currently loaded decision node or the digital output signal is output.

17 Claims, 11 Drawing Sheets

100

- Calculate ADC output probability histogram: $\Pr_k$ for $k=0,1,\ldots,2^{N-1}$
- Set: $r=0$ and $q=2^N$
- While search interval larger than 1 $((q-r)>1)$ For search interval $[r, q]$ find optimal threshold according to:

$$t = \arg\min_t \left( \left| \sum_{k=r}^{t} \Pr_k - \sum_{k=t+1}^{q-1} \Pr_k \right| \right)$$

Execute comparison based on result, narrow search interval borders:

if $(\hat{x}_t \leq x)$ then $r = r$ $q = t$ else then $r = t+1$ $q = q$

- End
- At the end of search iteration: $t_{OUT} = q = r+1$
- The resulting ADC outputs bit vector will be given by:

$$t_{OUT} = \left( \sum_{n=0}^{N-1} b_{OUT,n} \cdot 2^n \right)$$

FIG. 2A

| Node 0 | Node 1 | Node 2 |
|---|---|---|
| Threshold = 0V | Threshold = 1V | Threshold = -1V |
| Up = F (Node 1) | Up = T (11) | Up = T (01) |
| Down = F (Node 2) | Down = T (10) | Down = T (00) |

*FIG. 4E*

| Node 0 | Node 1 | Node 2 |
|---|---|---|
| Threshold = +1V | Threshold = 0V | Threshold = -1V |
| Up = T(11) | Up = T (10) | Up = T (01) |
| Down = F (Node 1) | Down = F (Node 2) | Down = T (00) |

*FIG. 4D*

MINIMUM SEARCH LENGTH ANALOG TO DIGITAL CONVERTER

FIELD

The disclosure generally relates to technology for a successive approximation register (SAR) analog to digital converter (ADC), and in particular, to an SAR ADC converting a sample of an analog signal to a digital code in a set of iterations.

BACKGROUND

Analog-to-digital conversion is often used to sample analog signals so that such signals may be digitally represented. The need for digital representation of analog signals arises in a variety of applications, such as digital communication receivers. For example, in multiple-input and multiple-output (MIMO) communications using millimeter wave (mmWave) frequencies, mmWave significantly increases the data rate by using very large bandwidths. To compensate for large pathloss, large antenna arrays with power-demanding ADCs are employed, which results in increased hardware power and consumption and overall cost.

BRIEF SUMMARY

According to one aspect of the present disclosure, there is provided an analog to digital converter (ADC) for converting an analog input signal into a digital output signal in a number of successive approximation cycles, including a sample and hold unit configured to sample a first analog signal; a digital-to-analog converter (DAC) configured to convert a feedback signal to a second analog signal; a comparator coupled to the sample and hold unit and the DAC, and configured to compare the sampled first analog signal with the second analog signal to generate an indication signal, the indication signal indicating whether a comparison result between the sampled first analog signal and the second analog signal can be determined; and a controller coupled to the DAC and the comparator and accessing decision nodes stored in memory, each decision node storing an optimal threshold value and an address to one or more next decision nodes, the controller configured to: load a current decision node from the memory and read the optimal threshold value associated with the current decision node; and compare the sampled first analog input signal with the optimal threshold value and, based on a result of the comparison, load the next decision node according to the address associated with the current decision node from the memory or output the digital output signal.

Optionally, in any of the preceding aspects, the ADC further includes a processor configured to: collect output statistics from the ADC; calculate a probability for each analog input signal based on the output statistics and generate a decision tree including the decision nodes; calculate the optimal threshold for each of the decision nodes in the decision tree using the calculated probability of each analog input signal over a search interval, the search interval comprising a lower boundary value and an upper boundary value; and wherein the decision tree and the associated optimal thresholds are stored in the memory for each of the decision nodes.

Optionally, in any of the preceding aspects, wherein the controller is further configured to: update the search interval to be between the lower boundary value and the optimal threshold value in response to the result of the comparison indicating that the sampled first analog signal is less than or equal to the optimal threshold value; and update the search interval to be between the optimal threshold value +1 and the upper boundary value in response to the result of the comparison indicating that the sampled first analog signal is greater than the optimal threshold value.

Optionally, in any of the preceding aspects, wherein the controller is further configured to: load a first output flag in response to the result of the comparison indicating that the sampled first analog signal is less than or equal to the optimal threshold value; load a second output flag in response to the result of the comparison indicating that the sampled first analog signal is greater than the optimal threshold value; output the digital output signal when the first or second output flag in the current decision node is true; and read an address of the next decision node from memory when the first or second output flag is false, and loading the next decision node at the read address.

Optionally, in any of the preceding aspects, wherein the optimal threshold value for the search interval is determined by the equation:

$$t = \underset{t}{\operatorname{argmin}}\left(\left|\sum_{k=r}^{t} Pr_k - \sum_{k=t+1}^{q-1} Pr_k\right|\right),$$

where t is the optimal threshold value, k is a number of analog input signals, Pr is the probability, r is a lower bound of the search interval and q is an upper bound of the search interval.

Optionally, in any of the preceding aspects, wherein the controller comprises a successive approximation register (SAR) and is further configured to: receive the comparison result from the comparator, store the comparison result and generate the feedback signal according to the comparison result, and feed the feedback signal back to the DAC, when the indication signal indicates that the comparison result can be determined.

Optionally, in any of the preceding aspects, wherein the memory stores the decision nodes as a decision tree structure and each of the decision nodes stores the optimal threshold value and one or more addresses such that the one or more addresses are pre-determined addresses and organized in multiple levels, the decision nodes including a root node and for each node at each level, except the lowest level, two child nodes in the immediately lower level, whereby the address of each child node is computable from the address of the respective decision node having that child node.

According to another aspect of the present disclosure, there is provided a method for converting an analog input signal to a digital output signal in a number of successive approximation cycles, including receiving a sampled analog input signal; loading a decision node from a decision tree stored in memory, each decision node in the decision tree storing an optimal threshold value and an address to one or more next decision nodes; reading the optimal threshold value, a first output flag and a second output flag associated with a currently loaded decision node in the decision tree from the memory; and comparing the sampled first analog input signal with the optimal threshold value and, based on a result of the comparison, loading a next decision node from the decision tree stored in the memory according to the address associated with the currently loaded decision node or output the digital output signal.

According to one other aspect of the present disclosure, there is provided an analog to digital converter (ADC) for converting an analog input signal into a digital output signal in a number of successive approximation cycles, comprising a non-transitory memory storage comprising instructions; and one or more processors in communication with the memory, wherein the one or more processors execute the instructions to: receive a sampled analog input signal; load a decision node from a decision tree stored in memory, each decision node in the decision tree storing an optimal threshold value and an address to one or more next decision nodes; read the optimal threshold value, a first output flag and a second output flag associated with a currently loaded decision node in the decision tree from the memory; and compare the sampled first analog input signal with the optimal threshold value and, based on a result of the comparison, loading a next decision node from the decision tree stored in memory according to the address associated with the currently loaded decision node or output the digital output signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

FIG. 2A illustrates a convergence algorithm in accordance with embodiments of the disclosure.

FIGS. 4D and 4E illustrate an example of information stored nodes of a decision tree memory.

DETAILED DESCRIPTION

The disclosure relates to technology for a successive approximation register analog to digital converter (SAR ADC), and in particular, to an SAR ADC converting a sample of an analog signal to a digital value in a set of iterations.

The technology relates to reducing the power consumption of an SAR ADC, especially in massive MIMO communications, that operate with large antenna arrays requiring a large number of analog frontends having ADCs. This is accomplished by replacing conventional convergence algorithms of the digital-to-analog converter (DAC) input of the SAR ADC with a minimum search length (MSL) algorithm in order to reduce the average number of clocks (comparisons) that is required for each analog to digital transformation. In one embodiment, the average number of clocks that is required for each analog to digital transformation is limited by the Shannon limit—the entropy of the input signal. In one other embodiment, the MSL algorithm reduces the average number of ADC operations such that when the resolution of the ADC is sufficiently large, the average number of ADC's clocks converges to the Shannon limit.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
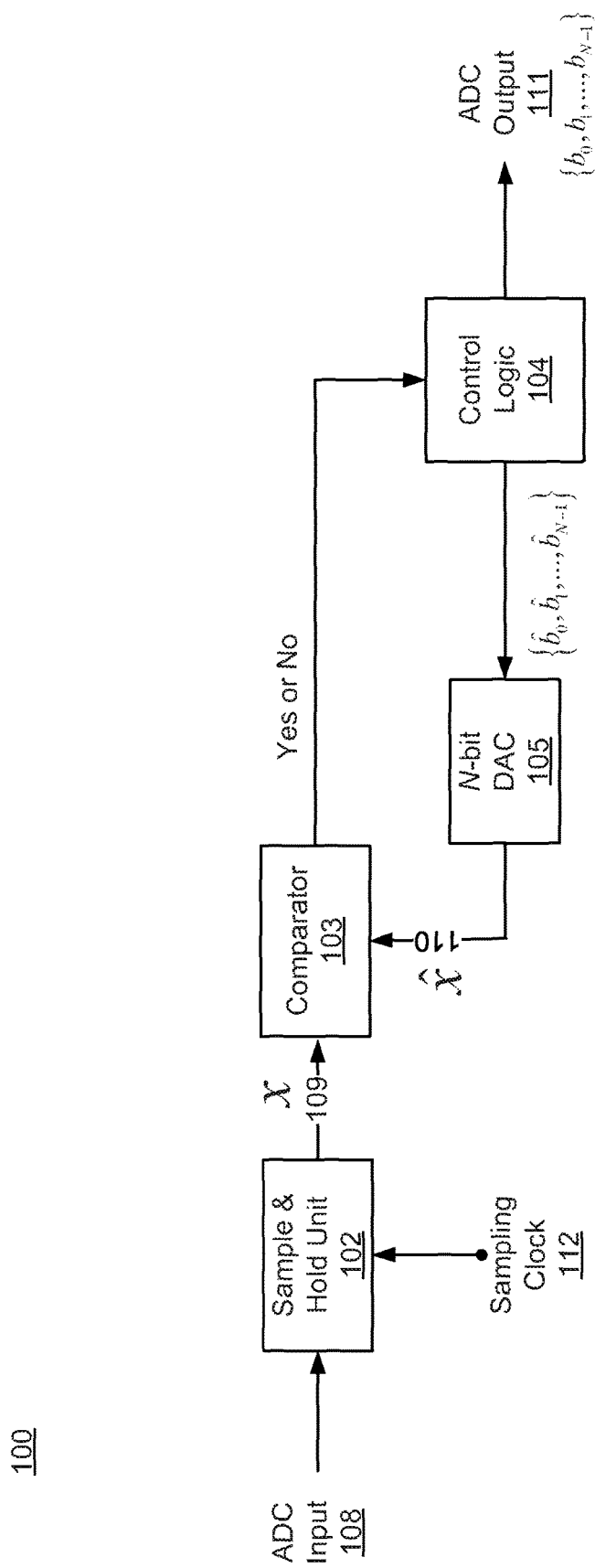
FIG. 1 illustrates a block diagram of a conventional successive approximation register analog-to-digital converter.

FIG. 1 illustrates a block diagram of a conventional successive approximation register analog-to-digital converter. Successive approximation register analog-to-digital converters (SAR-ADCs) are often used to generate digital codes (values) representing corresponding samples of an analog signal received as an input, SAR-ADCs employ a successive approximation principle (SAP) for generation of the digital codes, such that approximations of the analog signal are generated. These approximations are compared with the received analog signal until the digital codes representing the approximations have been resolved to the accuracy of a number (n) of bits available in the SAR-ADC for representing a sample of the analog signal.

More specifically, the SAR ADC 100 provides a binary search that requires N cycles for n-bits analog to digital conversion, such that the power consumption is proportional to the clock number. The SAR ADC 100 is an n-bit ADC including a sample and hold unit 102 (sampler), a comparator 103, control logic 104 (controller), and an N-bit DAC 105. The SAR ADC 100 receives an analog input (ADC input) 108 into the sample and hold unit 102. The ADC input 108 may be stored in the sample and hold unit 102 as a stored value 109. The stored value 109 may then be compared to the output 110 of the N-bit DAC 105. Based on the output of the comparison (in the form of an indication signal of 'Yes' or 'No'), the control logic 104 may tune a digital input-code of the DAC 105 such that the DAC 105 may approximate the ADC input 108. Specifically, if the indication is 'Yes' (the comparison may be determined), then the control logic 104 receives the comparison result from the comparator 103, stores the comparison result, generates a feedback signal according to the comparison result, and feeds the feedback signal back to the DAC 105. Otherwise, if the indication is 'No' (the comparison cannot be determined), then the current bit of the signal corresponding to the comparison result (and all less significant bits) is compensated such that the sum of the current bit and all less significant bits approximates a bit weight of the current bit.

In order to make the approximation, a binary search algorithm may be employed, such that n cycles of the algorithm are required to set the N-bits of the DAC 105 correctly. As the DAC 105 output 110 approximates the stored value 109, the digital code (value) of the DAC 105 yields a digital representation of the ADC input 108.

As appreciated by the skilled artisan, a binary search algorithm is a data structure that yields an efficient algorithm for searching through a large database for a particular entry. A conventional binary search tree (or decision tree) begins with a middle value (which depends on the number of bits N) which is then compared with the ADC input (e.g., ADC input 108). For purposes of an example, we will assume N=10 ($2^{10}$ bits) such that the lower value is '0', the middle value is '512' and the upper value is '1024'. Thus, when the output of the comparator is high ('1') (the sampled analog input>DAC input), then the value lies between '512' and '1024'. If the output of the comparator 103 is low ('0') (the sampled analog input<DAC input), then the value lies between '0' and '512'. The value is adjusted as a result of the comparison, and the process is repeated until the value equals (or is approximately equal to) the input value of the comparator. However, the binary search tree algorithm has several disadvantages including the comparison always beginning from the middle value even when the ADC input is near the boundary conditions and, when the current value is similar to the prior value, the number of comparisons is higher than the difference between the two numbers. This additional number of comparisons required in the ADC ultimately results in increased power consumption and costs.

FIG. 2A illustrates a convergence algorithm in accordance with embodiments of the disclosure. As discussed briefly above, SAR ADCs are used to generate a sequence of digital values (or codes) representing the respective signal levels of an analog signal. The speed of an SAR ADC is typically determined by the time duration to perform each iteration. Thus, SAR ADCs are often used in lower-power and lower-speed applications. However, for higher-power and faster-speed applications, lower power consumption ADCs are necessary in which power consumption is reduced by decreasing the number of iterations and the time for the DAC to stabilize its input value.

For an SAR ADC using a binary search, the same number of clocks is equal to the ADC resolution N for any input, where a resolution is defined as the number of discrete values or "levels" available assumed to be a power of two. For example, an ADC with a resolution of 8 bits can encode an analog input to one in 256 different levels, since $2^8$=256. It follows that the ADC internal clock is N times higher than the sampling clock (e.g., sampling clock 112, FIG. 1). Additionally, the binary search algorithm is optimal for uniform input probability distribution, but not necessarily for non-uniform input probability distribution.

In one embodiment of an SAR ADC, a convergence algorithm 200 is employed in which the average number of clocks for an analog to digital conversion transformation is limited by the ADC output entropy—i.e., the average number of operations that is necessary to find an input is smaller or equal to the ADC entropy that is its Shannon limit. In such a case, the average number of operations ($L_{AVERAGE}$) to find any input (k) may be defined by the equation:

$$L_{AVERAGE} \geq \sum_{k=0}^{2^N-1} Pr_k \cdot \log_2(1/Pr_k) \quad (1)$$

In one embodiment, the convergence algorithm 200 may be implemented by the control logic 104. In another embodiment, the convergence algorithm 200 may be implemented by the digital signal processor (DSP) 322 discussed below with reference to FIG. 3B. The convergence algorithm 200 may be referred to herein as the minimum search length (MSL) ADC algorithm 200.

As the SAR ADC 100 receives the ADC input 108, an ADC output 111 is generated. The ADC output 111 is a digital output which may be represented as bits $b_0, b_1 \ldots N-1$. Initially, each of the bits are set to zero, such that all bits of a bit vector B are set to zero, where B=($b_0$=0, $b_1$=0 ... $b_{N-1}$=0). The ADC output 111 for each iteration k (where k=0, 1, ..., $2^{N-1}$) is used to calculate a probability $\{P_0, P_1, P_{2^N-1}\}$ of each input to generate a probability histogram $Pr_k$, where the probability histogram $Pr_k$ is defined by the equation:

$$Pr_k = \begin{cases} \text{For } (k=0) & Pr\left(x < x_{MIN} + \frac{\Delta}{2}\right) \\ \text{For } (k=2^N-1) & Pr\left(x_{MIN} + (2^N-1)\cdot\Delta - \frac{\Delta}{2} \leq x\right) \\ \text{else} & Pr\left(x_{MIN} + k\cdot\Delta - \frac{\Delta}{2} \leq x < x_{MIN} + k\cdot\Delta + \frac{\Delta}{2}\right) \end{cases} \quad (2)$$

where x is the ADC input, $x_{MIN}$, is the minimum value of x, and $\Delta$ is the ADC step.

The histogram reports the number of times each digital code appears at the ADC output 111. Each conversion from analog signal to digital code is recorded as a "hit" and stored in a bank of counters (or bins) in memory, where each bin corresponds to each possible digital output of the SAR ADC 100. After each conversion, the digital code at the ADC output 111 is determined and the corresponding counter is incremented. Thus, for purposes of explanation, if a noiseless SAR ADC were connected to a dc voltage, the histogram of n conversions would indicate n code 'hits' in the bin corresponding to the digital code of the ADC input. All other bins would equal zero.

After the ADC output probability histogram has been calculated, a search interval [r,q−1] is set based on the number of bits N representing the digital output, where a lower boundary r is initially set to zero (r=0) and an upper boundary q is initially set to $2^N$ (q=$2^N$). For example, for an 8-bit DAC, the lower boundary r will be set to 0 and the upper boundary q−1 will be set to 255. Accordingly, the initial search interval will be [0,255].

While the search interval remains larger than '1' (i.e., (q−r)>1), an optimal threshold (t) (or optimal threshold value) for the search interval [r,q] may be determined according to:

$$t = \underset{t}{\mathrm{argmin}}\left(\left|\sum_{k=r}^{t} Pr_k - \sum_{k=t+1}^{q-1} Pr_k\right|\right) \quad (3)$$

This optimal threshold (t) may be used to narrow the search interval during each iteration of the SAR ADC 100 to achieve a lesser number of iterations required to provide a digital signal output. The optimal threshold (t) may be employed to narrow the search interval in a manner similar to the binary search algorithm which, as explained above, narrows the search interval by using a middle value of the current search interval, as opposed to determining an optimal threshold (t) by which to narrow the search interval. As will be explained in the discussion that follows, use of the optimal threshold (t) to narrow the search interval results in a fewer number of clocks to produce the digital signal output, thereby reducing the amount of power required by the SAR ADC 100.

Once the optimal threshold (t) has been calculated, a comparison of the ADC input 108 to the optimal threshold (t) is executed, and the search interval is narrowed according to the following:

if ($\hat{x}_i \leq x$) then $r=r$ $q=t$ else then $r=t+1$ $q=q$,     (4)

where is the comparison threshold

According to equation (4), when the ADC input 108 is less than or equal to the optimal threshold (t), the lower boundary r of the search interval does not change and the upper boundary q of the search interval is set to the optimal threshold (t). When the ADC input 108 is greater than the optimal threshold (t), the lower boundary of the search interval is set to the optimal threshold (t) value +1 and the upper boundary q of the search interval does not change.

As explained above, when the search interval is less than or equal to '1' (i.e., (q−r)>1), the iterations end and the resulting ADC output 111 is output from the SAR ADC 100. At the conclusion of the search iterations, $t_{OUT}$=q=r+1. The ADC output 111 is output as a bit vector $b_{OUT}$ (the digital output signal) as expressed by:

$$t_{OUT} = \left( \sum_{n=0}^{N-1} b_{OUT,n} \cdot 2^n \right)$$     (5)

Figure 2B:
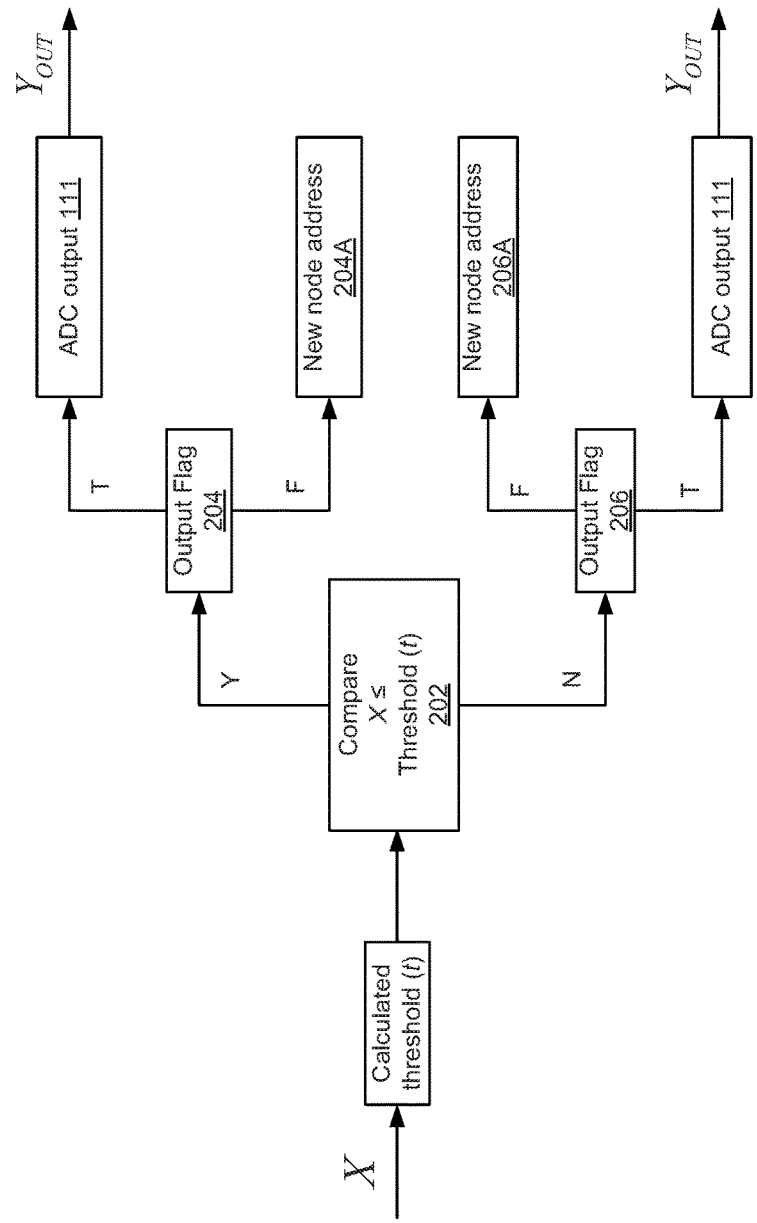
FIG. 2B illustrates a block diagram of a node implementing the convergence algorithm of FIG. 2A.

FIG. 2B illustrates a block diagram of a node implementing the MSL algorithm of FIG. 2A. The MSL algorithm 200 is a search technique for locating an item in an organized arrangement, such as a search (or decision) tree. The items in the arrangement are organized according to the values of the items, for example, in a sequential list (i.e., sequence of digital values or codes). A search constraint is compared to the value of one of the items in the arrangement. If a larger value is desired, then the search may continue in the portion of the arrangement having larger values, and if a smaller value is desired, then the search may continue in the portion of the arrangement having smaller values. In this way, each comparison reduces the number of potential matches, until the desired value is found.

A node is a decision point in the decision tree that may be set to a value of one of the items. Nodes may have up to two branches, with one branch receiving values that are less than the node value, and the other branch receiving values that are larger than the node value. The first value added to a branch becomes a node on that branch. As additional values are added, the branch grows by adding additional nodes and branches, and thereby becomes a subtree. By convention, a node with one or two branches may be referred to as a parent node, and the value added to each branch may be referred to as a child node. A node with no branches may be referred to as a leaf, and represents the terminal node on a particular subtree. Together, all of the nodes in the arrangement form the decision tree. Example decision trees will be discussed below with reference to FIGS. 4B and 4C.

The decision tree may be arranged by first selecting a root value. In an MSL decision tree (a decision tree formed where the MSL algorithm is executed by the SAR ADC), the root value is set according the calculated optimal threshold (t) (FIG. 2A). The root value becomes the first node on the decision tree, and also represents the first comparison value for a search to be conducted over a search interval. As values are added to the decision tree, values that are larger than the root value become nodes on a subtree extending from one branch of the root value, while values that are smaller than the root value become nodes on a subtree extending from a second branch of the root value. In a similar manner, each node (except a leaf node), enables a decision point representing one "greater than" path and one "less than" path.

Once the decision tree has been generated, a search routine (algorithm) is able to efficiently locate a desired value by making a series of comparisons at each of the nodes. FIG. 2B illustrates an example of one such comparison at a node in the decision tree. More specifically, when employing the MSL algorithm 200, when a node is reached in the decision tree, a comparison is made of the sampled analog input X to a predetermined threshold (t) having been calculated using the MSL search algorithm (described in FIG. 2A). In particular, the node determines whether the sampled analog input X is less than or equal to the threshold (t) at 202. Based on the result of the comparison at 202, the control logic 104 will proceed to one of output flag 204 or output flag 206. The output flag, stored in memory at each node, indicates whether the contents of a particular register contains an ADC output 111 or an address at a next decision node in the decision tree. It is appreciated that each of the ADC outputs 111 in FIG. 4B may be different.

If the comparison results in the sampled analog input X being less than or equal to the threshold (t), then the control logic 104 proceeds to load output flag 204 from memory. If output flag 204 is ON (True), then the ADC output 111 has been located and is output by the control logic 104, and the search is completed (the terminal node has been reached). Otherwise, if output flag 204 is OFF (False), the ADC output 111 has not been located and the search of the decision tree continues to the next decision node. The control logic 104 reads the next decision node address from memory and repeats the comparison with the threshold stored in the next decision node.

If the comparison results in the sampled analog input X is greater than the threshold (t), then the control logic 104 proceeds to load output flag 206 from memory. If output flag 206 is ON (True), then the ADC output 111 has been located and is output by the control logic 104, and the search is completed (the terminal node has been reached). Otherwise, if output flag 206 is OFF (False), the ADC output 111 has not been located and the search of the decision tree continues to the next decision node. The control logic 104 reads the next decision node address from memory and repeats the comparison with the threshold stored in the next decision node.

As the decision tree is traversed, each comparison will eliminate about half of the probabilities from consideration. After the search has located the desired value, that value is no longer available and is removed from the tree. Accordingly, the tree is rearranged (updated) to reflect the removal of the node. In a similar manner, the tree is rearranged as new values are added to the set of available items.

Figure 3A:
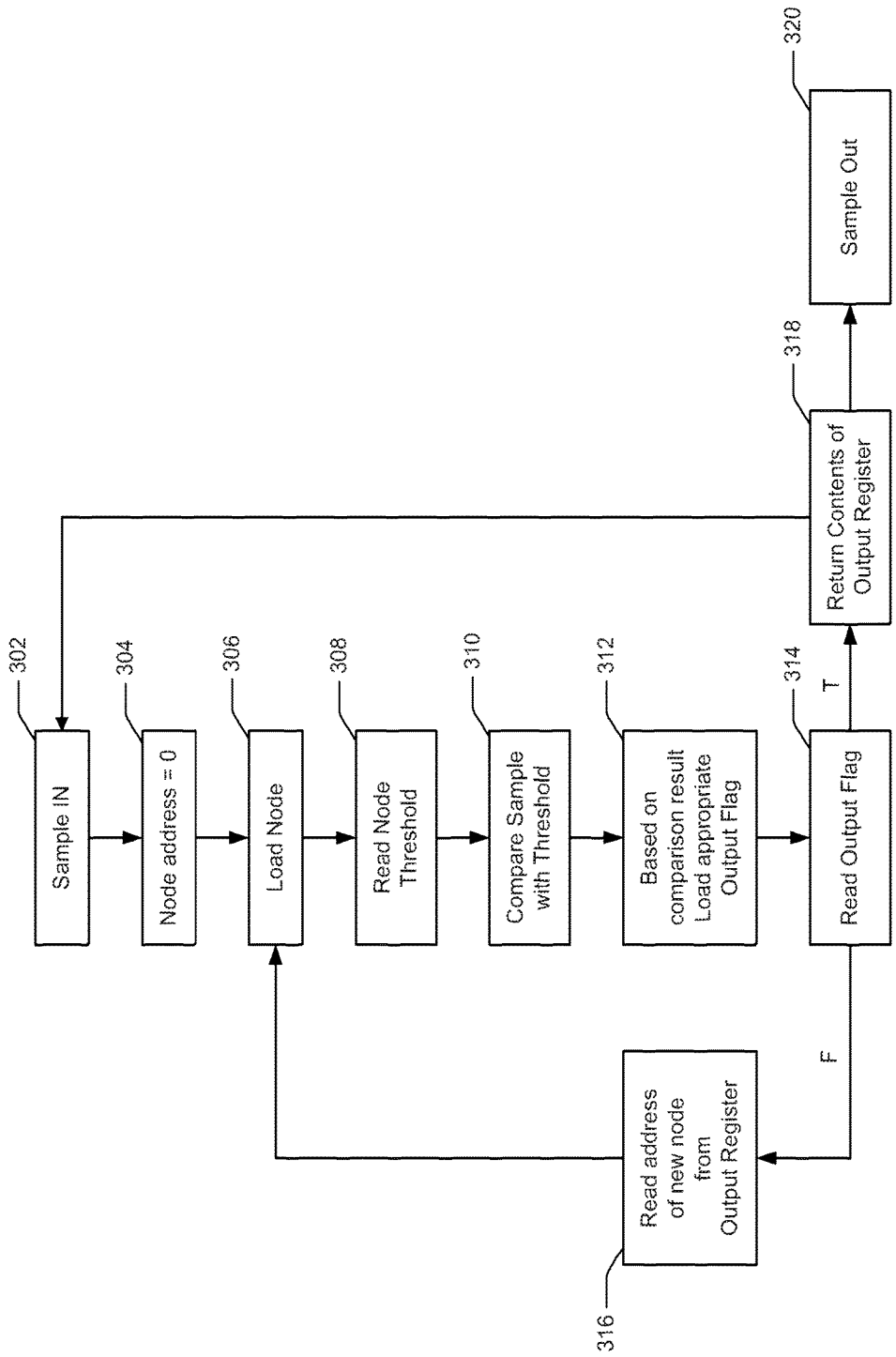
FIG. 3A illustrates a flow diagram of the convergence algorithm disclosed in FIG. 2B.

FIG. 3A illustrates a flow diagram of the convergence algorithm disclosed in FIG. 2B. In the example that follows, the convergence algorithm (MSL algorithm 200) is implemented by processor(s) 322 (discussed below with reference to FIG. 3B). In one embodiment, the processor(s) 322 is a digital signal processor (DSP). It is appreciated, however, that the MSL algorithm is not limited to implementation by the processor(s) 322 and that other components, such as control logic 104, of the disclosed ADCs may implement the MSL algorithm.

For purposes of discussion, a decision tree has been previously calculated and stored in memory of the SAR ADC, as discussed above with reference to FIG. 2B. At 302, the ADC input 108 is received at the processor(s) 322 and the address of the first decision node is read at 304. The contents of the current decision node are loaded from memory at 306. Each node in the decision tree is associated with a threshold value (threshold (t)) and two branches. Each branch may point to an address of a next decision node (e.g., a child node) in the decision tree and/or to output information, such as the ADC output 111. An output flag (e.g., output flag 204 or 206) stored in the decision node indicates whether a particular branch points to an address of the next decision node or the output information of the ADC output 111, as noted above.

At 308, the processor(s) 322 reads the threshold (t) stored at the current node and the threshold (t) is compared to the received sample IN (sampled analog input signal) at 310. Based on a result of the comparison at 310, one of output flag 204 and output flag 206 of the current node is loaded from memory at 312. More specifically, output flag 204 of the current node is loaded from memory in response to the result of the comparison indicating that the sampled IN is less than or equal to the threshold (t). Otherwise, output flag 206 of the current node is loaded from memory in response to the result of the comparison indicating that the sampled IN is greater than the threshold (t).

At 314, the selected output flag 204 or 206 is read from memory. When the output flag of a branch is set to TRUE (on), the output (contents from the output register) is read from memory at 318 and the digital output signal is output. The process then repeats, where the next sample IN is loaded from memory at 302. If the output flag of a branch is set to FALSE (off), the address (address from the output register) of the next decision node is read from memory at 316 and the next decision node in the decision tree is loaded from memory at 306.

An example implementation of the MSL algorithm is detailed below h reference to FIGS. 4A and 4B.

Figure 3B:
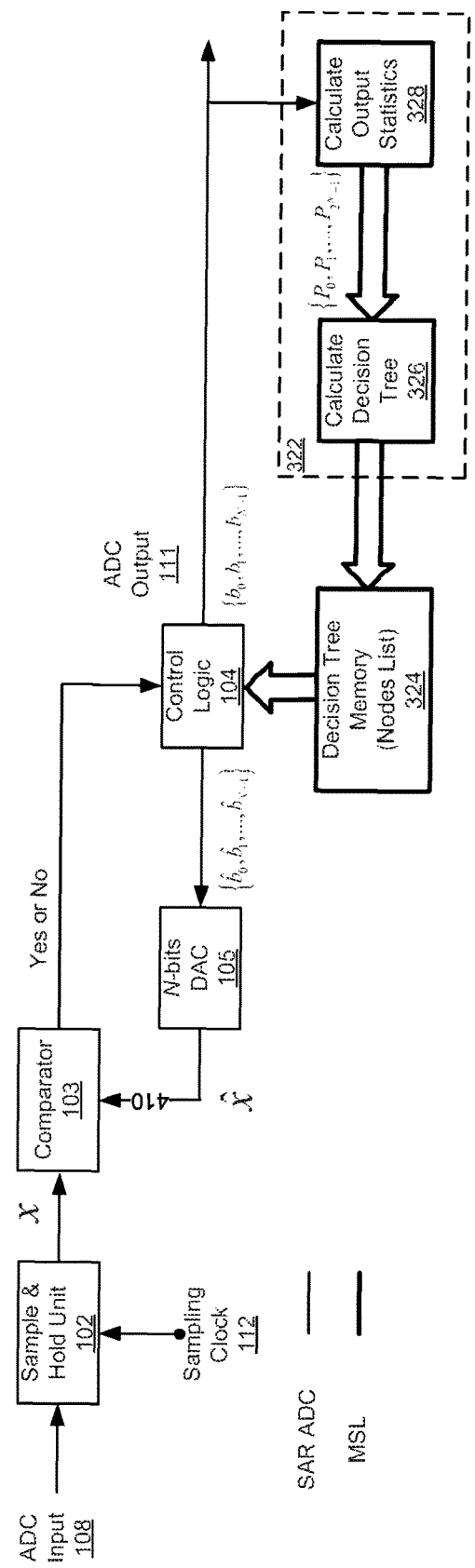
FIG. 3B illustrates a block diagram of an MSL ADC in accordance with the disclosed technology.

FIG. 3B illustrates a block diagram of an MSL ADC 300 in accordance with the disclosed technology. The MSL ADC 300, which implements the MSL algorithm 200, includes the components of the conventional SAR ADC 100, such as the sample and hold unit 102 (receiving ADC input 108 and sampling clock 112), comparator 103, N-bit DAC 105 and control logic 104 (outputting ADC output signal 111). The SAR ADC 300 operates in a manner as described above with respect to FIG. 1, and additionally illustrates a decision tree memory (nodes list) 324, described below. It is appreciated that the SAR ADC 100 (FIG. 1) may also include a decision tree memory, although the implementation and structure of such decision tree memory may be different from the MSL ADC 300.

The MSL ADC 300, in addition to the components of SAR ADC 100, includes the decision tree memory (nodes list) 324 and a communicatively coupled processor(s) 322 that is responsible for calculating output statistics 328 and decision tree 326 (which is stored in decision tree memory 324). In one embodiment, the processor(s) is a digital signal processor (DSP) that is sufficiently fast to perform complex calculations related to the output statistics and decision tree. As illustrated, the processor(s) 322 is located remote from the SAR ADC 300. However, it is appreciated that the processor(s) 322 may also be a part of the SAR ADC 300 or configured in such a manner that complex calculations may be executable in the control logic 104. For example, the control logic 104 may be able to process digital signal data.

The MSL ADC 300 output statistics 328 may be collected to calculate a probability $\{P_0, P_1, \ldots, P_{2^N-1}\}$ of each input, for example by processor(s) 322, using a probability distribution function, such as a normal (Gaussian) probability distribution function. The ADC output 111 of the MSL ADC 300 results in a sequence of digital codes (values) that have been converted from a continuous-time and continuous-amplitude analog signal to a discrete-time and discrete-amplitude digital signal. Such conversion can involve quantization of the input that can lead to the introduction of a small amount of error—i.e., the noise introduced by quantization in an "ideal" ADC.

Using the MSL ADC 300, the input analog signal is converted to a digital representation using a series of bit trials performed sequentially from a most-significant bit (MSB) to a least-significant bit (LSB). In each bit trial, a comparator compares the input analog signal to a reference voltage and based on the comparator decisions, the respective bit is resolved as either a '1' or '0'. However, errors can enter the conversion process. Typically, the larger the conversion error, the worse the signal-to-noise ratio (SNR) of the ADC. Conventional approaches to reduce conversion errors include resolving smaller bits to reduce quantization errors or tuning components to reduce circuit noise. For example, it is possible to use a Gaussian noise source for determining a Bit Error Rate (BER) in digital communication channels. Furthermore, it has been shown in G. Evans, J. Goes, and N. Paulino: "*On-Chip Built-in Self-Test of Video-Rate ADCs using a 1.5 V CMOS Noise Generator*", IEEE ISCAS, 2005, pp. 796-799, how histogram testing using a Gaussian noise test signal is performed for DNL/INL measurements in video-rate Analog-to-Digital Converters (ADCs).

From the calculated probabilities $\{P_0, P_1, \ldots, P_{2^N-1}\}$, the processor(s) 322 calculates a decision tree 326 which may be stored in the decision tree memory 324 in the form of nodes, as described above with reference to FIG. 2A. The decision tree may then be read by (input into) the control logic 104 of the MSL ADC 300 for processing by the MSL algorithm 200, also described above with respect to FIG. 2A.

In one embodiment, a decision tree engine (not shown) may be used to organize the available memory 324 into an efficient arrangement for a search by control logic 104 (or processor(s) 322). To generate (or update) the decision tree, the control logic 104 provides information regarding a set of available memory blocks. This information may include the size and start address for each block of available memory, for example. The decision tree engine applies the set of available blocks to generate an organized decision tree, which may then be searched using the MSL algorithm 200.

Figure 4A:
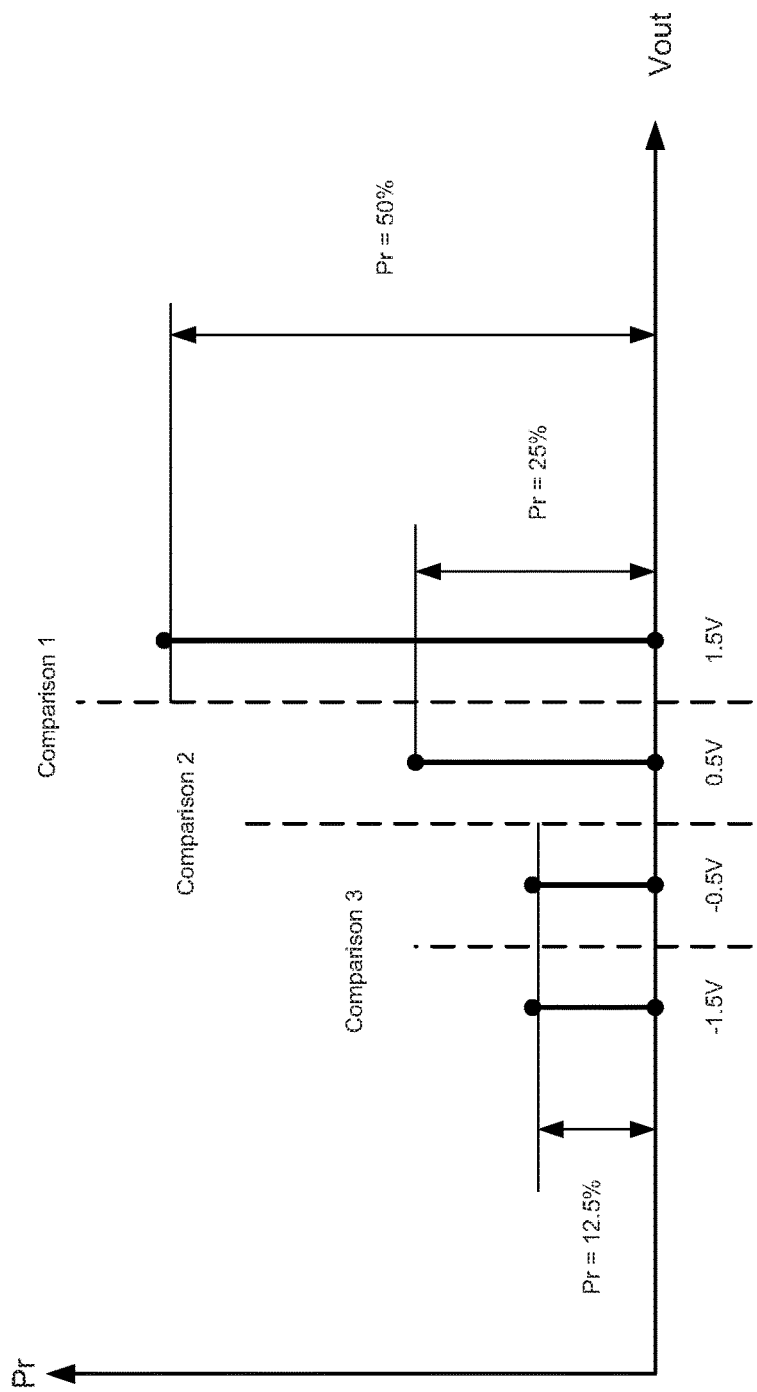
FIG. 4A illustrates an example of input distributions and decision thresholds
Figure 4B:
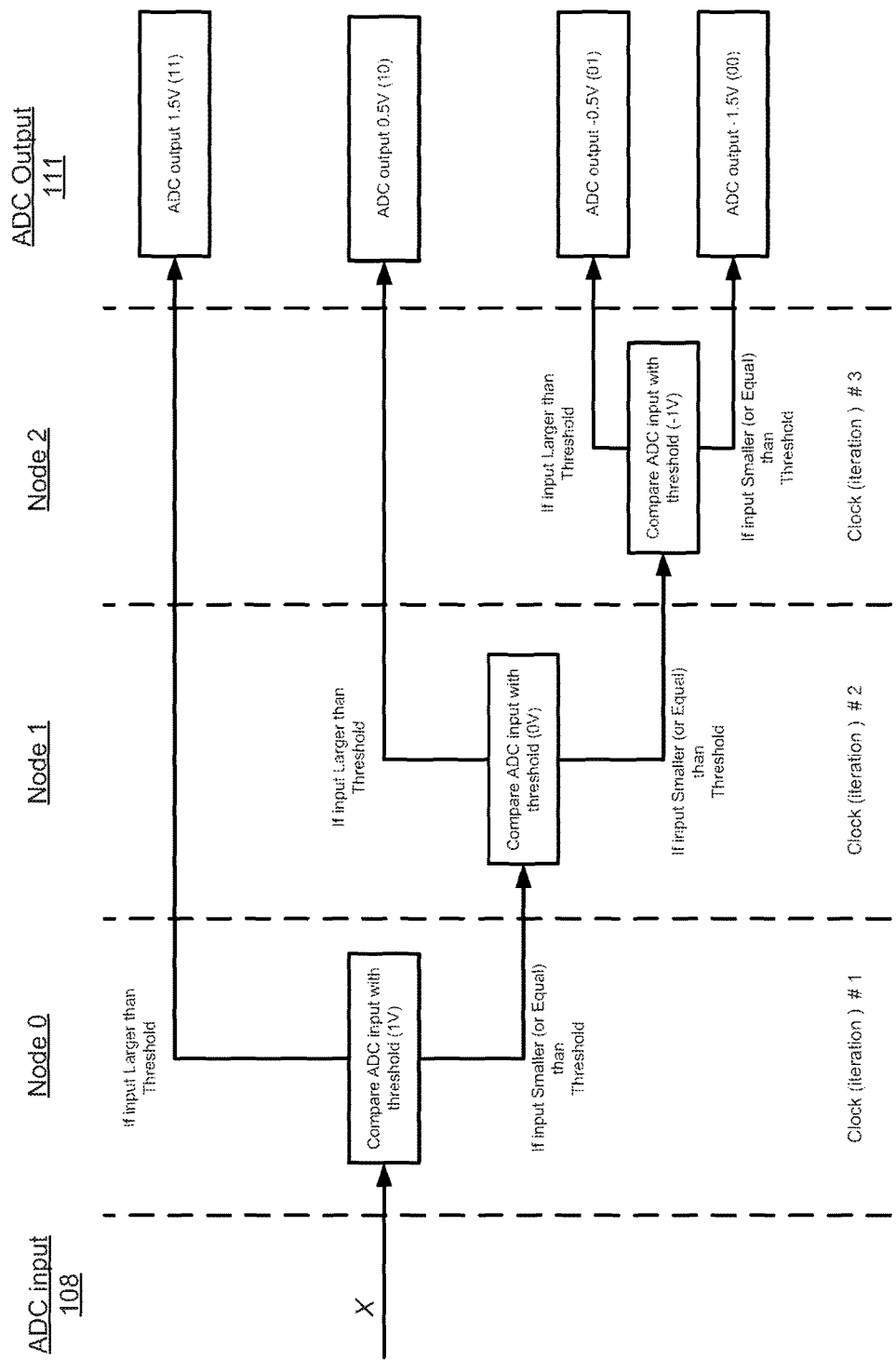
FIGS. 4B and 4C illustrate example decision trees.

FIGS. 4A and 4B illustrate an example of input distributions and decision thresholds and an example MSL ADC decision tree. Specifically, FIG. 4A illustrates an example of a graph having input distributions and decision thresholds for an analog input into an SAR ADC, and FIG. 4B illustrates an example decision tree in which the analog input is compared to a decision threshold at each node in the tree. In the example, and for purposes of discussion, a 2-bit (N=2) ADC is employed in which a search interval is [0,3], where the lower boundary is '0' and the upper boundary is '3.' However, it is appreciated that the ADC may employ a greater number of bits and is not limited to a 2-bit implementation. Moreover, in the example, the MSL ADC 300 of FIG. 3B is responsible for implementation of the comparisons as the MSL algorithm 200 is employed to traverse the decision tree.

As illustrated, the horizontal axis (x-axis) of the graph shows the output voltage ($V_{out}$) of the analog signal. For example, along the x-axis are analog outputs of 1.5V, 0.5V, −0.5V and −1.5V. The vertical axis (y-axis) of the graph shows the probability distribution (Pr) at each of the voltage outputs. For example, the probability (Pr) that the ADC output voltage will be 1.5V when the ADC input (analog input) is compared (comparison 1) to a predetermined threshold (e.g., 1V) is fifty percent (Pr=50%). Likewise, the probability (Pr) that the ADC output voltage will be 0.5V when the comparison (comparison 2) is made will be twenty-five percent (Pr=25%), the probability (Pr) that the ADC output voltage will be −0.5V when the comparison (comparison 3) is made will be twelve and a half percent (Pr=12.5%), and the probability (Pr) that the ADC output voltage will be −1.5V when the comparison (comparison 3) is made will be twelve and a half percent (Pr=12.5%).

More specifically, for the analog input (ADC input 108), the processor(s) 322 collects the ADC output 111 and generates statistics. The statistics are used to calculate a probability $\{P_0, P_1, \ldots, P_{2^N-1}\}$ of each ADC input 108. For example, during N samples, the processor(s) 322 calculates the probability of each ADC output 111 as:

$$P_0 = Pr(x < -1V) = Pr(ADC_{OUT} = 00) = \lim_{N \to \infty}\left(\frac{N_{00}}{N}\right) \approx \frac{N_{00}}{N} = 0.125$$

$$P_1 = Pr(-1V \le x < 0V) = Pr(ADC_{OUT} = 01) = \lim_{N \to \infty}\left(\frac{N_{01}}{N}\right) \approx \frac{N_{01}}{N} = 0.125$$

$$P_2 = Pr(1V \le x < +1V) = Pr(ADC_{OUT} = 10) = \lim_{N \to \infty}\left(\frac{N_{10}}{N}\right) \approx \frac{N_{10}}{N} = 0.25$$

$$P_3 = Pr(+1V \le x < +2V) = Pr(ADC_{OUT} = 11) = \lim_{N \to \infty}\left(\frac{N_{11}}{N}\right) \approx \frac{N_{11}}{N} = 0.5,$$

where $N_k$ is the number of iterations when the ADC output is equal to k ($ADC_{OUT}=k$) and N is the total number of iterations (statistics duration) where $$N = \sum_{k=0}^{3} N_k.$$

From the calculated probabilities vector $\{P_0=0.125, P_1=01.25, P_2=0.25, P_3=0.5\}$, the processor(s) 322 then calculates the decision tree thresholds using the MSL algorithm 200, as explained above.

The input distribution and decision threshold graph is now explained with reference to FIG. 4B. As illustrated, a decision tree is formed and stored in decision tree memory 324 according to the techniques described herein. The decision tree in the depicted example has three nodes (Node 0, Node 1 and Node 2), where each node is responsible for making a comparison of the ADC input (analog input 108) to an optimal threshold (t), as explained above with reference to FIG. 2B. It is appreciated that the number of nodes is limited in the disclosed example, but that any number of nodes may exist.

Each node may have two branches—a branch may extend to another node (child-node) in the decision tree (i.e., the node points to a child node address in the decision tree memory 324) or signal the control logic to read memory of the register to output the ADC output 111. If the node is a leaf node, in which no branches extend from the node (i.e., the node is a terminal node), then the node only outputs an ADC output 111, A node may also have a combination of one branch extending to another node and another branch signaling the control logic to output the ADC output signal 111. For example, Node 0 and Node 1 each have one branch that points to the address in decision tree memory 324 of a child node (Node 1 and Node 2, respectively), and one output which provides the ADC output 111 (ADC output 1.5V which is represented digitally as (11) and ADC output 0.5V which is digitally represented as (10), respectively). On the other hand, Node 3 (which is a leaf node) has two ADC outputs 111 (ADC output −0.5V which is digitally represented by (01) and ADC output −1.5V which is digitally represented by (00)).

Each node in decision tree memory 324 stores an optimal threshold (t) (calculated as described above) and an output flag (indicating whether a node branches to a child node or an output). Thus, when an ADC input 108 is received at the SAR ADC 300, the decision tree node is traversed according to the MSL algorithm 200. An example of the information stored in a decision tree memory 324, in which the MSL algorithm 200 is employed, may be found in FIG. 4D.

Following the example of FIG. 4A, and assuming the optimal threshold (t) was previously determined, during clock (iteration) #1, the ADC input 108 is compared to an optimal threshold (t)=1V at Node 0. If the ADC input 108 is larger than the optimal threshold (t), then the ADC output 1.5V (11) is output by the SAR ADC 300. If the ADC input 108 is less than or equal to the optimal threshold (t), then the decision tree node is traversed to the child node pointed to by decision tree memory 324 (in this case, to Node 1). During clock (iteration) #2, the ADC input 108 is compared to an optimal threshold (t)=0V at Node 1. If the ADC input 108 is larger than the optimal threshold (t), then the ADC output 0.5V (10) is output by the SAR ADC 300. If the ADC input 108 is less than or equal to the optimal threshold (t), then the decision tree node is traversed to the child node pointed to by decision tree memory 324 (in this case, to Node 2). At clock (iteration) #3, the ADC input 108 is compared to an optimal threshold (t)=−1V at Node 3. If the ADC input 108 is larger than the optimal threshold (t), then the ADC output −0.5V (01) is output by the SAR ADC 300. If the ADC input 108 is less than or equal to the optimal threshold (t), then the ADC output −1.5V (00) is output by the SAR ADC 300.

As appreciated, since the number of bits N=2, the maximum number of clocks that the MSL ADC 300 will use for such input distribution is three clocks: $L_{MAX}=3$. However, while the maximum number of clocks is three, the average number of ADC clocks is represented by the equation:

$$L_{AVERAGE} = \sum_{k=0}^{2^N-1} P_k \cdot \log_2\left(\frac{1}{Pr_k}\right) = 0.5 \cdot 1 + 0.25 \cdot 2 + 0.125 \cdot 3 = 1.75 \qquad (6)$$

As derived from equation (6), when applying the probability vector $\{P_0=0.125, P_1=01.25, P_2=0.25, P_3=0.5\}$, the average number of ADC clocks is 1.75. For comparison, a conventional SAR ADC 100 for the same input requires 2 clocks constantly. Accordingly, the average number of clocks for the MSL ADC 300 is ¼ less than the number of clocks required for the conventional SAR ADC 100. Thus, on average, there is a ¼ power consumption reduction when applying the MSL algorithm 200 to the SAR ADC 300.

Figure 4C:
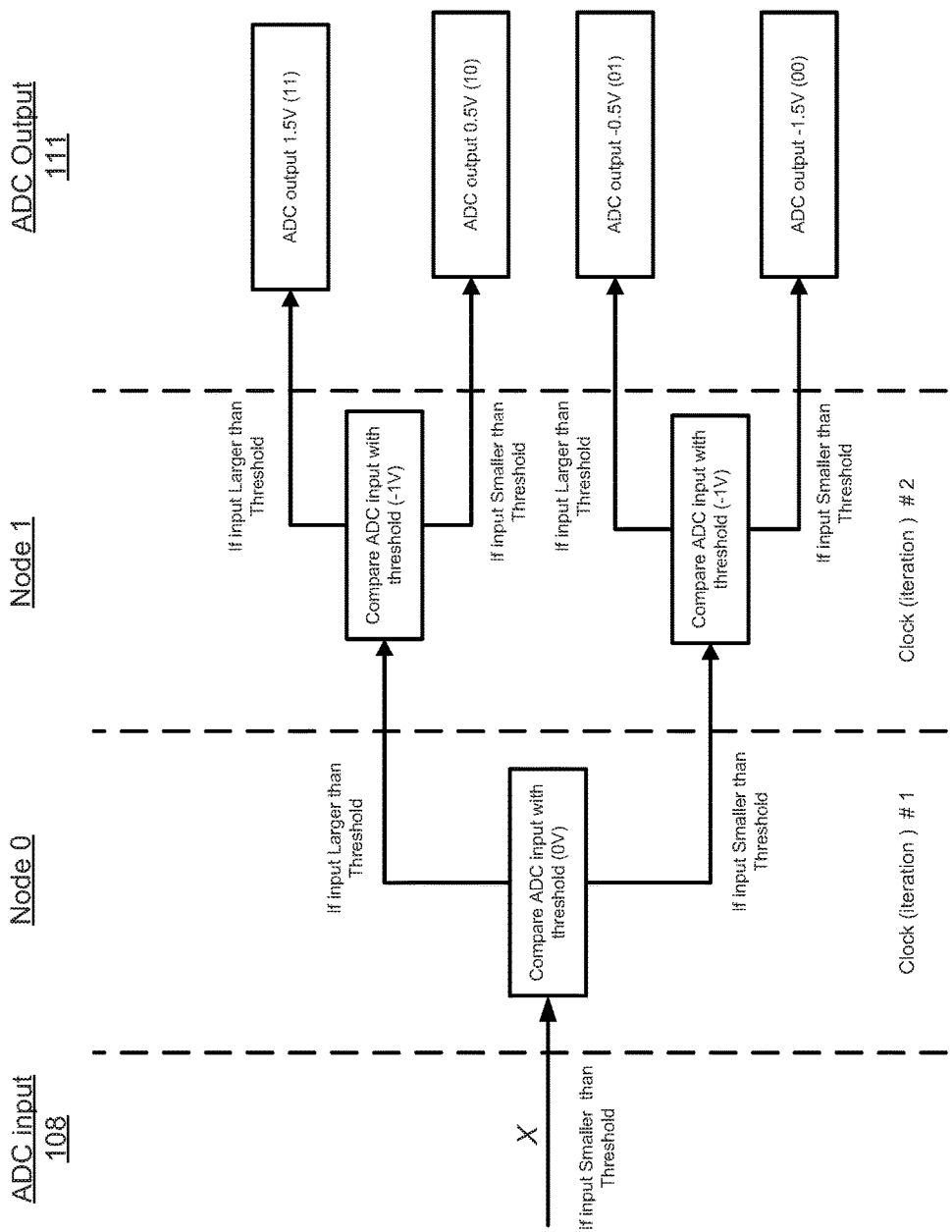

Against the backdrop of FIG. 4B, and for purposes of comparison, FIG. 4C illustrates a conventional binary decision tree. The binary decision tree in the depicted example has two nodes (Node 0 and Node 1), where each node is responsible for making a comparison of the ADC input (analog input 108) to a threshold. The structure of a node is similar to the nodes described above, in that each node may have two branches extending to either a child node or an ADC output 111. Each node in the binary decision tree a threshold and an output flag (indicating whether a node branches to a child node or an output). Thus, when an ADC input 108 is received at the SAR ADC 100, the binary decision tree node is traversed according to a binary search algorithm (implemented as discussed above). An example of the information stored in a binary decision tree memory 324, in which the binary search algorithm is employed, may be found in FIG. 4E.

In the depicted example, the ADC input 108 is compared to a threshold=0V at Node 0. If the ADC input 108 is larger than the threshold, then the binary decision tree is traversed to the child node pointed to in memory (in this case, Node 1), where a further comparison (second iteration) is completed. Here, the ADC input 108 is compared to a threshold of −1V. If the ADC input 108 at Node 1 is larger than the threshold, then the SAR ADC 100 outputs an ADC output 111 of 1.5V (digitally represented by (11)). If the ADC input 108 at Node 1 is smaller than the threshold, then the SAR ADC 100 outputs an ADC output 111 of 0.5V (digitally represented by (10)).

If the ADC input 108 at Node 0 is less than the threshold, then the binary decision tree node is traversed to the child node pointed to by memory (in this case, to Node 1), where a further comparison (second iteration) is completed. Here, the ADC input 108 is also compared to a threshold of −1V. If the ADC input 108 at Node 1 is larger than the threshold, then the SAR ADC 100 outputs an ADC output 111 of −0.5V (digitally represented by (01)). If the ADC input 108 at Node 1 is smaller than the threshold, then the SAR ADC 100 outputs an ADC output 111 of −1.5V (digitally represented by (00)).

As explained above, a conventional SAR ADC 100 for the same input requires 2 clocks constantly, which on average is ¼ clocks more than the MSL algorithm 200. However, it is appreciated that the example is non-limiting and that any number of nodes may be in the binary decision tree.

Figure 5:
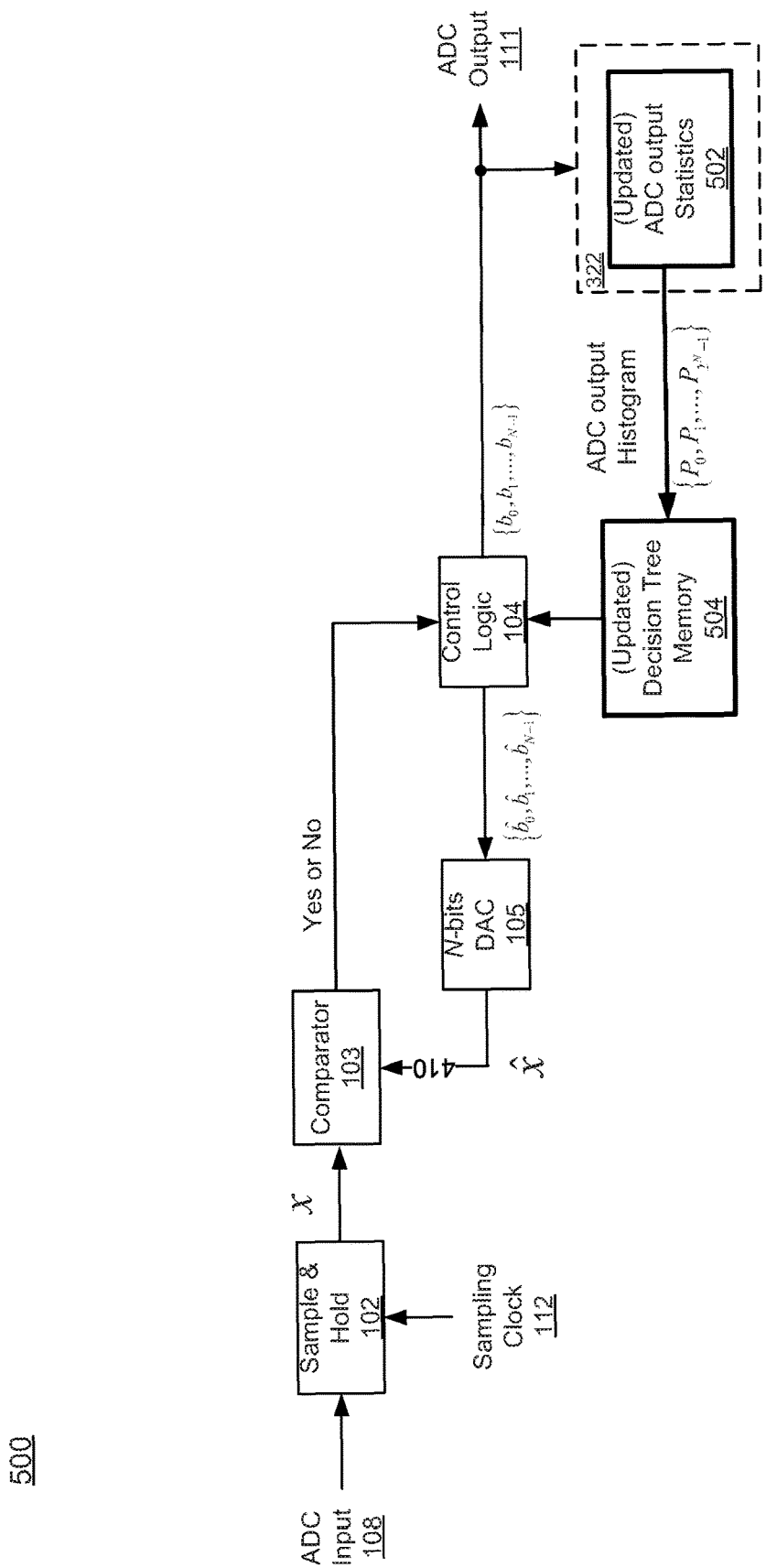
FIG. 5 illustrates another embodiment of the SAR ADC of the disclosure.

FIG. 5 illustrates another embodiment of the SAR ADC of the disclosure. The SAR ADC 500 is similar to SAR ADC 200 (FIG. 3B), although additionally includes an updated ADC output statistics 502 (in processor(s) 322) and an updated decision tree memory 504.

During an analog-to-digital conversion operation, the output probability distribution (e.g., $\{P_0, P_1, \ldots, P_{2^N-1}\}$) may be changed or modified. In order for the SAR ADC 500 to be able to adjust to these changes or modifications, the SAR ADC 500 utilizes a decision tree adaptation mechanism in which the update ADC output statistics 502 provides an ADC output histogram (probability distribution) for the update decision tree 504 that subsequently updates the decision tree in memory according to the MSL algorithm 200.

In one embodiment, the ADC output statistics are collected. For example, the memory storing the decision tree may have a size equal to $2^N$, where N is the number of bits. Initially, the all registers in memory are equal to zero, such that $$R(k)=0 \; k=0,1,\ldots,2^N-1 \qquad (7)$$

Each time there is an ADC output 111, the register is incremented with an address equal to the ADC output such that $$R(ADC_{OUT})=R(ADC_{OUT})+1 \qquad (8)$$

After $K_{UPDATE}$ sampling clocks, the ADC output histogram is formed according to $$P_k=R(k)/K_{UPDATE} \; k=0,1,\ldots,2^N-1 \qquad (9)$$

All registers are then reset to zero to collect new ADC output statistics.

In one embodiment, the routine may be repeated every $K_{UPDATE}$ sampling clocks, in order to permanently update statistics. Thus, even if the input suddenly changes, it will not result in ADC errors. Instead, only a temporary increase in the average clock number and power consumption will occur, which will resolve to normal after the newly updated statistics are output.

In one other embodiment, if there is no prior SAR ADC 500 input distribution (no input has been received previously), then the SAR ADC 500 begins with the assumption that all inputs are distributed uniformly, such that $$P_k=1/(2^N) \; k=0,1,\ldots,2^N-1 \qquad (10)$$

In this embodiment, the SAR ADC 500 (which employs the MSL algorithm) has a decision tree that is equivalent or similar to a decision tree of a conventional SAR ADC (e.g., an SAR ADC that employs a binary search algorithm) and operates as a conventional SAR ADC with a number of clocks equal to N. The number of clocks and power consumption will reduce after updated statistics are received.

Figure 6:
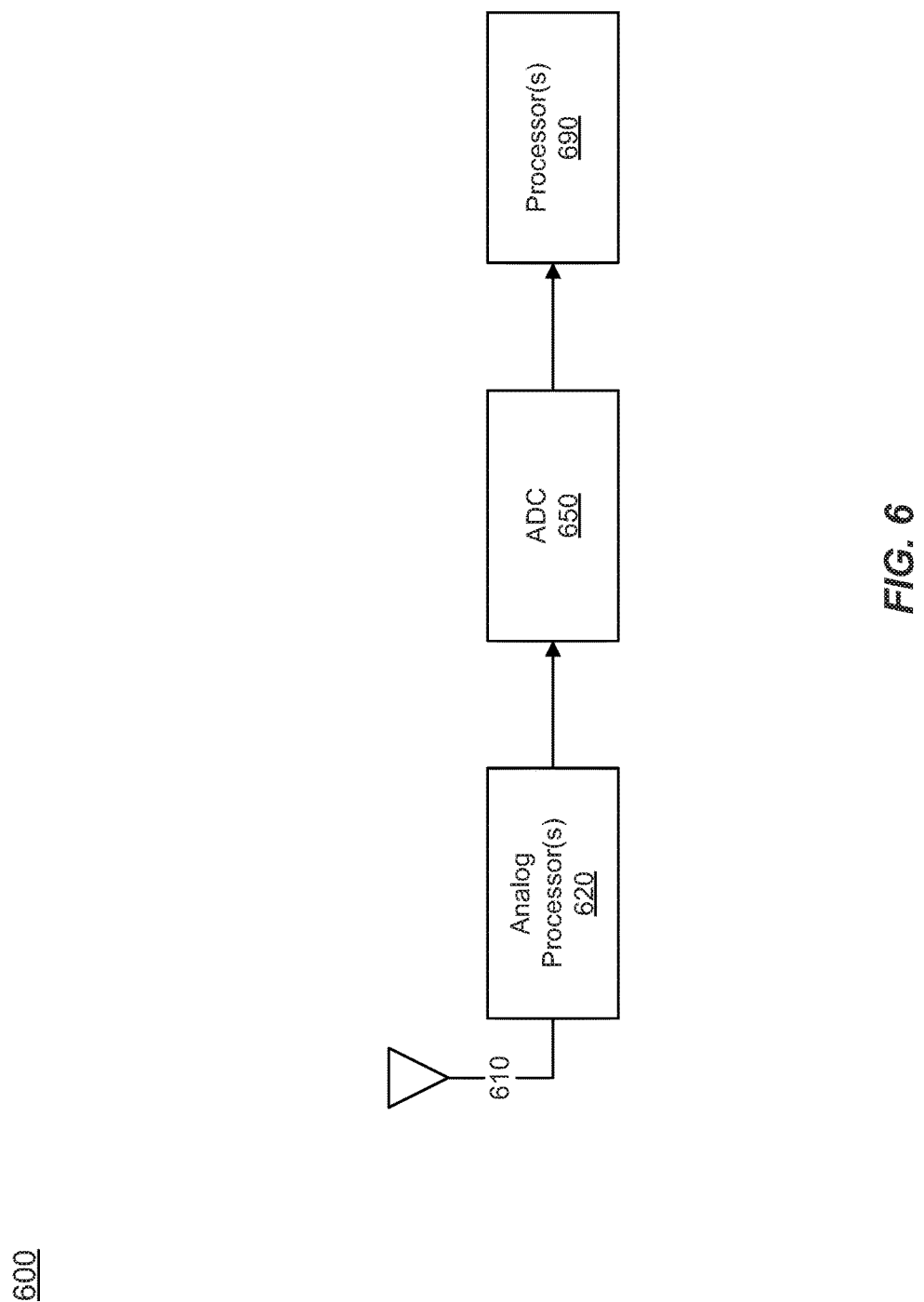
FIG. 6 illustrates an example receiver system.

FIG. 6 illustrates an example receiver system. Receiver system 600 may correspond to receivers such as a Global Positioning System (GPS) receiver, communication receivers such as an FM (frequency modulation) receiver or a base station (e.g., gNB), etc. In the depicted embodiment, the receiver system 600 includes antenna 610, analog processor 620, ADC 650, and processor(s) 690.

Antenna 610 may receive various signals transmitted on a wireless medium. The received signals may be provided to analog processor 620 for further processing, such as performing amplification (or attenuation), filtering, frequency conversion, etc., on the received signals and provides the resulting processed signal to ADC 650. In one embodiment, ADC 650 is an SAR ADC according to the embodiments of the present disclosure.

ADC 650 converts the analog signal to corresponding digital values, which are provided for further processing on processor(s) 690. Processor(s) 690, upon receipt of the converted digital values, processes the data values to provide various user applications.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An analog to digital converter (ADC) system for converting an analog input signal into a digital output signal in a number of successive approximation cycles, comprising:
    a sample and hold unit configured to sample a first analog signal;
    a digital-to-analog converter (DAC) configured to convert a feedback signal to a second analog signal;
    a comparator coupled to the sample and hold unit and the DAC, and configured to compare the sampled first analog signal with the second analog signal to generate an indication signal, the indication signal indicating whether a comparison result between the sampled first analog signal and the second analog signal can be determined;
    a controller coupled to the DAC and the comparator and accessing decision nodes stored in memory, each decision node storing an optimal threshold value and an address to one or more next decision nodes, the controller configured to:
        load a current decision node from the memory and read the optimal threshold value associated with the current decision node; and
        compare the sampled first analog input signal with the optimal threshold value and, based on a result of the comparison, load the next decision node according to the address associated with the current decision node from the memory or output the digital output signal; and
    a processor configured to:
        collect output statistics from the ADC;
        calculate a probability for each analog input signal based on the output statistics and generate a decision tree including the decision nodes;
        calculate the optimal threshold for each of the decision nodes in the decision tree using the calculated probability of each analog input signal over a search interval, the search interval comprising a lower boundary value and an upper boundary value; and
    wherein the decision tree and the associated optimal thresholds are stored in the memory for each of the decision nodes.

2. The ADC of claim 1, wherein the controller is further configured to:
    update the search interval to be between the lower boundary value and the optimal threshold value in response to the result of the comparison indicating that the sampled first analog signal is less than or equal to the optimal threshold value; and
    update the search interval to be between the optimal threshold value +1 and the upper boundary value in response to the result of the comparison indicating that the sampled first analog signal is greater than the optimal threshold value.

3. The ADC of claim 1, wherein the controller is further configured to:
    load a first output flag in response to the result of the comparison indicating that the sampled first analog signal is less than or equal to the optimal threshold value;
    load a second output flag in response to the result of the comparison indicating that the sampled first analog signal is greater than the optimal threshold value;
    output the digital output signal when the first or second output flag in the current decision node is true; and read an address of the next decision node from memory when the first or second output flag is false, and loading the next decision node at the read address.

4. The ADC of claim 1, wherein the optimal threshold value for the search interval is determined by the equation:

$$t = \underset{t}{\mathrm{argmin}}\left(\left|\sum_{k=r}^{t} Pr_k - \sum_{k=t+1}^{q-1} Pr_k\right|\right)$$

where t is the optimal threshold value, k is a number of analog input signals, Pr is the probability, r is a lower bound of the search interval and q is an upper bound of the search interval.

5. The ADC of claim 1, wherein the controller comprises a successive approximation register (SAR) and is further configured to:
receive the comparison result from the comparator,
store the comparison result and generate the feedback signal according to the comparison result, and
feed the feedback signal back to the DAC, when the indication signal indicates that the comparison result can be determined.

6. The ADC of claim 1, wherein the memory stores the decision nodes as a decision tree structure and each of the decision nodes stores the optimal threshold value and one or more addresses such that the one or more addresses are pre-determined addresses and organized in multiple levels, the decision nodes including a root node and for each node at each level, except the lowest level, two child nodes in the immediately lower level, whereby the address of each child node is computable from the address of the respective decision node having that child node.

7. A method for converting an analog input signal to a digital output signal in a number of successive approximation cycles, comprising:
receiving a sampled analog input signal;
loading a decision node from a decision tree stored in memory, each decision node in the decision tree storing an optimal threshold value and an address to one or more next decision nodes;
reading the optimal threshold value, a first output flag and a second output flag associated with a currently loaded decision node in the decision tree from the memory;
comparing the sampled first analog input signal with the optimal threshold value and, based on a result of the comparison, loading a next decision node from the decision tree stored in the memory according to the address associated with the currently loaded decision node or outputting the digital output signal;
sampling a first analog signal at a sample and hold unit and generating the sampled analog input signal;
converting a feedback signal to a second analog signal at a digital-to-analog converter (DAC); and
comparing the sampled analog signal with the second analog signal to generate an indication signal at a comparator communicatively coupled to the sample and hold unit and the DAC, the indication signal indicating whether a comparison result between the sampled analog signal and the second analog signal can be determined.

8. The method of claim 7, further comprising:
collecting output statistics from the ADC;
calculating a probability for each analog input signal based on the output statistics and generate a decision tree including the decision nodes;
calculating the optimal threshold for each of the decision nodes in the decision tree using the calculated probability of each analog input signal over a search interval, the search interval comprising a lower boundary value and an upper boundary value; and
storing the decision tree and the associated optimal thresholds for each of the decision nodes in the memory.

9. The method of claim 8, further comprising:
updating the search interval to be between the lower boundary value and the optimal threshold value in response to the result of the comparison indicating that the sampled analog signal is less than or equal to the optimal threshold value; and
updating the search interval to be between the optimal threshold value +1 and the upper boundary value in response to the result of the comparison indicating that the sampled analog signal is greater than the optimal threshold value.

10. The method of claim 7, further comprising:
loading a first output flag in response to the result of the comparison indicating that the sampled analog signal is less than or equal to the optimal threshold value;
loading a second output flag in response to the result of the comparison indicating that the sampled analog signal is greater than the optimal threshold value;
outputting the digital output signal when the first or second output flag in the currently loaded decision node is true; and
reading an address of the next decision node from the memory of the currently loaded decision node when the first or second output flag is false, and loading the next decision node at the read address.

11. The method of claim 8, wherein the optimal threshold value for the search interval is determined by the equation:

$$t = \underset{t}{\mathrm{argmin}}\left(\left|\sum_{k=r}^{t} Pr_k - \sum_{k=t+1}^{q-1} Pr_k\right|\right),$$

where t is the optimal threshold value, k is a number of analog input signals, Pr is the probability, r is a lower bound of the search interval and q is an upper bound of the search interval.

12. The method of claim 7, further comprising:
receiving the comparison result from the comparator,
storing the comparison result and generating the feedback signal according to the comparison result, and
feeding the feedback signal back to the DAC, when the indication signal indicates that the comparison result can be determined.

13. An analog to digital converter (ADC) for converting an analog input signal into a digital output signal in a number of successive approximation cycles, comprising:
a non-transitory memory storage comprising instructions; and
one or more processors in communication with the memory, wherein the one or more processors execute the instructions to:

receive a sampled analog input signal;
load a decision node from a decision tree stored in memory, each decision node in the decision tree storing an optimal threshold value and an address to one or more next decision nodes;
read the optimal threshold value, a first output flag and a second output flag associated with a currently loaded decision node in the decision tree from the memory; and
compare the sampled first analog input signal with the optimal threshold value and, based on a result of the comparison, load a next decision node from the decision tree stored in memory according to the address associated with the currently loaded decision node or output the digital output signal;
sample a first analog signal at a sample and hold unit and generating the sampled analog input signal;
convert a feedback signal to a second analog signal at a digital-to-analog converter (DAC); and
compare the sampled analog signal with the second analog signal to generate an indication signal at a comparator communicatively coupled to the sample and hold unit and the DAC, the indication signal indicating whether a comparison result between the sampled analog signal and the second analog signal can be determined.

14. The ADC of claim 13, wherein the one or more processors further execute the instructions to:
collect output statistics from the ADC;
calculate a probability for each analog input signal based on the output statistics and generate a decision tree including the decision nodes;
calculate the optimal threshold for each of the decision nodes in the decision tree using the calculated probability of each analog input signal over a search interval, the search interval comprising a lower boundary value and an upper boundary value; and
wherein, the decision tree and the associated optimal thresholds for each of the decision nodes are stored in the memory.

15. The ADC of claim 14, wherein the one or more processors further execute the instructions to:
update the search interval to be between the lower boundary value and the optimal threshold value in response to the result of the comparison indicating that the sampled analog signal is less than or equal to the optimal threshold value; and
update the search interval to be between the optimal threshold value +1 and the upper boundary value in response to the result of the comparison indicating that the sampled analog signal is greater than the optimal threshold value.

16. The ADC of claim 13, wherein the one or more processors further execute the instructions to:
load a first output flag in response to the result of the comparison indicating that the sampled analog signal is less than or equal to the optimal threshold value;
load a second output flag in response to the result of the comparison indicating that the sampled analog signal is greater than the optimal threshold value;
output the digital output signal when the first or second output flag in the currently loaded decision node is true; and
read an address of the next decision node from the memory of the currently loaded decision node when the first or second output flag is false, and loading the next decision node at the read address.

17. The ADC of claim 14, wherein the optimal threshold value for the search interval is determined by the equation:

$$t = \mathop{\mathrm{argmin}}_{t}\left(\left|\sum_{k=r}^{t} Pr_k - \sum_{k=t+1}^{q-1} Pr_k\right|\right),$$

where t is the optimal threshold value, k is a number of analog input signals, Pr is the probability, r is a lower bound of the search interval and q is an upper bound of the search interval.

* * * * *